(12) United States Patent
Vinet et al.

(10) Patent No.: US 8,962,399 B2
(45) Date of Patent: Feb. 24, 2015

(54) METHOD OF MAKING A SEMICONDUCTOR LAYER HAVING AT LEAST TWO DIFFERENT THICKNESSES

(71) Applicants: Commissariat a l'Energie Atomique et aux Ene Alt, Paris (FR); STMicroelectronics (Crolles 2) SAS, Crolles (FR); STMicroelectronics SA, Montrouge (FR)

(72) Inventors: Maud Vinet, Rives (FR); Yves Morand, Grenoble (FR); Heimanu Niebojewski, Grenoble (FR)

(73) Assignees: Commissariat a l'Energie Atomique et aux Energies Alternatives, Paris (FR); STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 14/177,593

(22) Filed: Feb. 11, 2014

(65) Prior Publication Data

US 2014/0370666 A1 Dec. 18, 2014

(30) Foreign Application Priority Data

Feb. 11, 2013 (FR) ...................................... 13 51144

(51) Int. Cl.
*H01L 21/00* (2006.01)
*H01L 29/66* (2006.01)
(Continued)

(52) U.S. Cl.
CPC .... *H01L 29/66477* (2013.01); *H01L 21/02236* (2013.01); *H01L 21/02667* (2013.01); *H01L 21/30604* (2013.01); *H01L 21/3065* (2013.01); *H01L 21/7624* (2013.01)
USPC ............................ 438/151; 438/154; 438/275

(58) Field of Classification Search
USPC .................. 438/151, 154, 155, 157, 275, 276
See application file for complete search history.

(56) References Cited

U.S. PATENT DOCUMENTS 6,020,615 A 2/2000 Lee
6,232,155 B1 5/2001 Lee
(Continued)

FOREIGN PATENT DOCUMENTS

DE 101 45 699 A1 4/2003
FR 2 938 202 A1 5/2010
(Continued)

OTHER PUBLICATIONS

French Preliminary Search Report issued Aug. 27, 2013 in Patent Application No. 1351142 (with English translation of Categories of Cited Documents).

(Continued)

*Primary Examiner* — Kevin M Picardat
(74) *Attorney, Agent, or Firm* — Oblon, Spivak, McClelland, Maier & Neustadt, L.L.P.

(57) ABSTRACT

A method is provided for producing a semiconductor layer having at least two different thicknesses from a stack of the semiconductor on insulator type including at least one substrate on which an insulating layer and a first semiconductor layer are successively disposed, the method including etching the first layer so that said layer is continuous and includes at least one first region having a thickness less than that of at least one second region; oxidizing the first layer to form an electrically insulating oxide film on a surface thereof so that, in the first region, the oxide film extends as far as the insulating layer; partly removing the oxide film to bare the first layer outside the first region; forming a second semiconductor layer on the stack, to form, with the first layer, a third continuous semiconductor layer having a different thickness than that of the first and second regions.

18 Claims, 3 Drawing Sheets

(51) Int. Cl.
  *H01L 21/02* (2006.01)
  *H01L 21/306* (2006.01)
  *H01L 21/3065* (2006.01)
  *H01L 21/762* (2006.01)

(56) References Cited

U.S. PATENT DOCUMENTS

| | | | |
|---|---|---|---|
| 6,300,218 B1 | 10/2001 | Cohen et al. | |
| 6,468,880 B1 | 10/2002 | Lim et al. | |
| 6,593,205 B1 | 7/2003 | Cheng et al. | |
| 6,756,257 B2 | 6/2004 | Davari et al. | |
| 6,936,506 B1* | 8/2005 | Buller et al. | 438/197 |
| 7,282,402 B2* | 10/2007 | Sadaka et al. | 438/221 |
| 7,504,696 B2* | 3/2009 | Zhu et al. | 257/369 |
| 7,888,747 B2* | 2/2011 | Hokazono | 257/392 |
| 8,324,039 B2* | 12/2012 | Griebenow | 438/197 |
| 8,349,694 B2* | 1/2013 | Kronholz et al. | 438/275 |
| 2006/0022270 A1 | 2/2006 | Boyd et al. | |
| 2006/0094182 A1 | 5/2006 | Hanafi et al. | |
| 2007/0166890 A1 | 7/2007 | Cheng et al. | |
| 2007/0278591 A1 | 12/2007 | Luo et al. | |
| 2010/0200930 A1* | 8/2010 | Fujii et al. | 257/391 |
| 2011/0189834 A1 | 8/2011 | Castex et al. | |
| 2012/0273886 A1 | 11/2012 | Zhong et al. | |

FOREIGN PATENT DOCUMENTS

| | | |
|---|---|---|
| JP | 2004-296744 | 10/2004 |
| WO | WO 2010/049654 A1 | 5/2010 |

OTHER PUBLICATIONS

A. Baghizadeh, et al., "Formation of As enriched layer by steam oxidation of As+–implanted Si" Applied Surface Science, vol. 255, 2009, pp. 5857-5860.

M. Bauer, et al., "Low temperature Si:C co-flow and hybrid process using $Si_3H_8/Cl_2$" Thin Solid Films, vol. 520, 2012, pp. 3133-3138.

Erich Biermann, et al., "Oxide Growth Enhancement on Highly n-Type Doped Silicon under Steam Oxidation" J. Electrochem. Soc., vol. 143, No. 4, Apr. 1996, pp. 1434-1442.

B. E. Deal, et al. "Thermal Oxidation of Heavily Doped Silicon" Journal of the Electrochemical Society, vol. 112, No. 4, Apr. 1965, pp. 430-435.

E. Biermann, "Silicon Oxidation Rate Dependence on Dopant Pile-up" IEEE, 1989, 1 Page.

Yong-Hoon Son, et al., "Laser-induced Epitaxial Growth (LEG) Technology for High Density 3-D Stacked Memory with High Productivity" IEEE Xplore, VLSI Technology, 2007, 1 Page.

Chunshan Yin, et al., "Investigation of the source/drain asymmetric effects due to gate misalignment in planar double-gate MOSFETs" IEEE Xplore, Electronic Devices, vol. 52, No. 1, Jan. 2005, 1 Page.

K. Cheng, et al. "Fully Depleted Extremely Thin SOI Technology Fabricated by a Novel Integration Scheme Featuring Implant-Free, Zero-Silicon-Loss, and Faceted Raised Source/Drain" VLSI Technology, Jun. 16-18, 2009, 1 Page.

French Preliminary Search Report and Written Opinion issued Sep. 16, 2013, in Patent Application No. FR 1351144, filed Feb. 11, 2013 (with English Translation of Category of Cited Documents).

* cited by examiner

METHOD OF MAKING A SEMICONDUCTOR LAYER HAVING AT LEAST TWO DIFFERENT THICKNESSES

TECHNICAL FIELD OF THE INVENTION

The present invention concerns in general a method for manufacturing a semiconductor layer having different thicknesses and forming part for example of the manufacture of transistors of the metal oxide semiconductor field effect transistor (MOSFET) type. One advantageous but non-limitative application concerns more particularly the production of a substrate of the semiconductor on insulator type, the semiconductor layer of which has at least two distinct thicknesses and on which the logic transistors and analogue transistors are formed.

PRIOR ART

For some microelectronic applications, it is sought to form, on the same wafer, pairs of matched transistors, that is to say transistors having the same electrical characteristics. Current mirrors appear among these applications for example.

One of the parameters normally studied to quantify dispersion within a pair of matched transistors is the difference in their threshold voltage. This is because variations in threshold voltage cause in particular fluctuations in performance and an increase in power consumption.

In a conventional technology on solid silicon, the dispersion stems mainly from dopant fluctuations (RDF, standing for random dopant fluctuation). Since this source of dispersion is random, it has a tendency to decrease when the surface area of the transistor increases (averaging of the number of dopants).

For this reason, when a person skilled in the art seeks to have very well matched transistors, he conventionally uses large transistors having a large surface area. In particular, large analogue transistors are used in pairs for current reference definition structures, current mirrors, current comparators, etc.

The use of the technology of transistors of the fully depleted silicon on insulator type (FDSOI, standing for fully depleted SOI), eliminates some sources of variability such as random dopant fluctuation (RDF).

However, FDSOI technology introduces a new source of variability between transistors. This is because the thickness $T_{Si}$ of the thin layer of silicon on top of the insulating layer of the SOI (silicon on insulator) substrate may vary from one device to another and affect the characteristics of the transistors. In particular, variations in the thickness $T_{Si}$ give rise to significant variations in the threshold voltage of the transistors disposed on its surface.

This variability is not entirely random. The thicknesses at two very distant points on the same SOI wafer have more chances of being very different than at two points close together. This means that, within a group of transistors, the further apart the transistors are, the greater will be the variability.

It is also clear that, the finer the thickness $T_{Si}$ of the layer of silicon, the more the threshold voltage fluctuates.

In order to optimise FDSOI technology it may therefore be desirable to have a fine thickness of silicon for logic transistors and a greater thickness for analogue transistors matched with logic transistors (analogue matching transistors).

It would therefore be necessary to propose a solution for obtaining a semiconductor layer having two different thicknesses.

Solutions have already been sought to achieve this. These solutions propose producing stacks of the SOI type from a layer of buried oxide (buried insulating oxide, BOX) having different thicknesses. The layer of silicon disposed above the layer of BOX then also has different thicknesses.

In the document U.S. Pat. No. 6,300,218, a layer of BOX is formed by a SIMOX method (separation by implantation of oxygen) during which the layer of BOX is thickened at certain areas by effecting a localised implantation of oxygen through a mask and then annealing. Different thicknesses of silicon $T_{Si}$ are then defined above the different thicknesses of the layer of BOX.

However, with this solution it is very tricky to precisely control the thickness of the layer of BOX in the thickened areas. Furthermore, in the thickened areas, poor uniformity of thickness of the layer of BOX is found. Finally, the profile of the passage from a thick area to a thin area of the buried oxide layer is not sufficiently abrupt. This increases the minimum separation of the devices that will be defined on the layer of silicon, thus reducing the integration density.

The American U.S. Pat. No. 6,593,205 proposes a method for localised formation of the layer of BOX that is also based on the SIMOX technology of formation of the layer of BOX by ion implantation and annealing. In this solution, the method comprises a step of ion implantation of oxygen to form a layer of silicon dioxide, and then an implantation of ions non-soluble in silicon dioxide through a mask. Annealing is then carried out. Only the areas that have not received the second implantation form an insulating layer.

One important drawback of this invention lies in the impossibility of forming a continuous buried oxide layer. Moreover, it proves very tricky to precisely control the thickness and uniformity of the buried oxide layer.

The American U.S. Pat. No. 6,756,257 proposes another method based on SIMOX technology. In this solution, an implantation of oxygen is effected through a dielectric mask in order to locally vary the depth at which the layer of BOX is produced in the substrate. The layer of silicon situated above the layer of BOX therefore has variations in thickness. With this method it is difficult to obtain an abrupt junction between two different thicknesses of silicon. It is also difficult to obtain good uniformity of thickness of the buried oxide layer within the same area. In addition, even with an optimised SIMOX method, it is difficult to avoid the formation of faults at the locally formed ends of the thicknesses of the BOX layer.

The above paragraph mentions many drawbacks that the known solutions have. The present invention aims to afford a solution for reducing or eliminating at least some of these drawbacks.

SUMMARY OF THE INVENTION

According to one embodiment, the present invention proposes a method for producing a semiconductor layer having at least two different thicknesses ($T_{Si1}$, $T_{Si2}$) and fitting on top of a substrate and an insulating layer. The method is implemented using a stack of the semiconductor on insulator type comprising at least one substrate on which there are successively disposed an insulating layer and a first semiconductor layer preferably having a homogeneous thickness. The method comprises at least a sequence comprising the following steps:

local etching of the first semiconductor layer so that the first semiconductor layer remains continuous and comprises at least one first region the thickness ($t_{Si1}$) of which is less than the thickness ($t_{Si2}$) of at least one second region; the local etching thus forms at least one cavity in the first semiconductor layer;

oxidation of the first semiconductor layer in order to form a film of electrically insulating oxide on the surface of the first semiconductor layer so that, in the first region, the film of oxide extends as far as the insulating layer of the initial stack and so that, in the second region, the film of oxide does not extend as far as the insulating layer; thus, at the first regions, the film of oxide forms, with the insulating layer of the initial stack of the semiconductor on insulator type, a continuous insulation layer from the substrate as far as the free face turned outwards;

partial removal of the film of oxide so as to bare the first semiconductor layer outside the first region and to keep at least part of the film of oxide in the first region; the film of oxide associated with the insulating layer thus forms a protrusion of oxide at each first region;

formation, on the stack of layers, of a second semiconductor layer so as to form, with the first semiconductor layer, a third continuous semiconductor layer having regions with different thicknesses ($T_{Si1}$, $T_{Si2}$).

Thus the first regions have a thickness of semiconductor layer equal to $T_{Si1}$ and the second regions will have a thickness $T_{Si2}$ of semiconductor layer equal to $T_{Si1}$ with the residual thickness of the first semiconductor layer added (the thickness of the first semiconductor layer remaining in the second regions after the step of partial removal of the film of oxide).

The invention thus proposes a particularly simple method for forming a semiconductor layer having different thicknesses from a semiconductor layer with a thickness that is preferably homogeneous. Transistors comprising different thicknesses of semiconductor can thus be integrated on the same wafer using a conventional semiconductor on insulator stack.

Advantageously, the invention makes it possible to obtain, for each region, a thickness of semiconductor material that is uniform and controlled precisely.

Another advantage of the invention lies in the possibility of obtaining abrupt profiles, that is to say very steep junctions between the regions of different thicknesses. This makes it possible in particular to increase the integration density.

Moreover, it has turned out that the invention makes it possible to reduce or even eliminate any defects at the junction between two regions of different thicknesses.

Furthermore, the invention makes it possible to produce a semiconductor layer the outwardly turned face of which is flat. This is because the thick regions of semiconductor material do not form a projection on the surface. The stack of layers obtained with the invention can thus be used with the standard methods using stacks of layers the free surface of which is flat.

The invention is thus particularly advantageous for co-integrating different thicknesses of semiconductor for technologies of the FDSOI (field effect transistor of the fully depleted silicon on insulator) or Trigate type.

According to another aspect, the present invention relates to a method for producing a semiconductor layer having at least two different thicknesses ($T_{Si1}$, $T_{Si2}$) and lying on top of a substrate and an insulating layer, using a stack of the semiconductor on insulator type comprising at least one substrate, an insulating layer and a first semiconductor layer, the method comprising at least a sequence comprising the following steps:

local etching of the first semiconductor layer so that the first semiconductor layer is continuous and comprises at least one first region the thickness ($t_{Si1}$) of which is less than the thickness ($t_{Si2}$) of at least one second region;

oxidation of the first semiconductor layer in order to form a film of electrically insulating oxide on the surface of the first semiconductor layer so that, in the first region, the film of oxide extends as far as the insulating layer;

partial removal of the film of oxide so as to bare the first semiconductor layer outside the first region;

formation, on the stack of layers, of a second semiconductor layer so as to form, with the first semiconductor layer, a third continuous semiconductor layer.

Preferably, the method also comprises the formation of transistors of a first type on the first region and the formation of transistors of a second type on the second region.

The other objects, features and advantages of the present invention will emerge from an examination of the following description and the accompanying drawings. Naturally other advantages may be incorporated.

BRIEF DESCRIPTION OF THE FIGURES

The aims, objects, features and advantages of the invention will emerge more clearly from the detailed description of an embodiment of the latter that is illustrated by the following accompanying drawings, in which.

Figure 1:
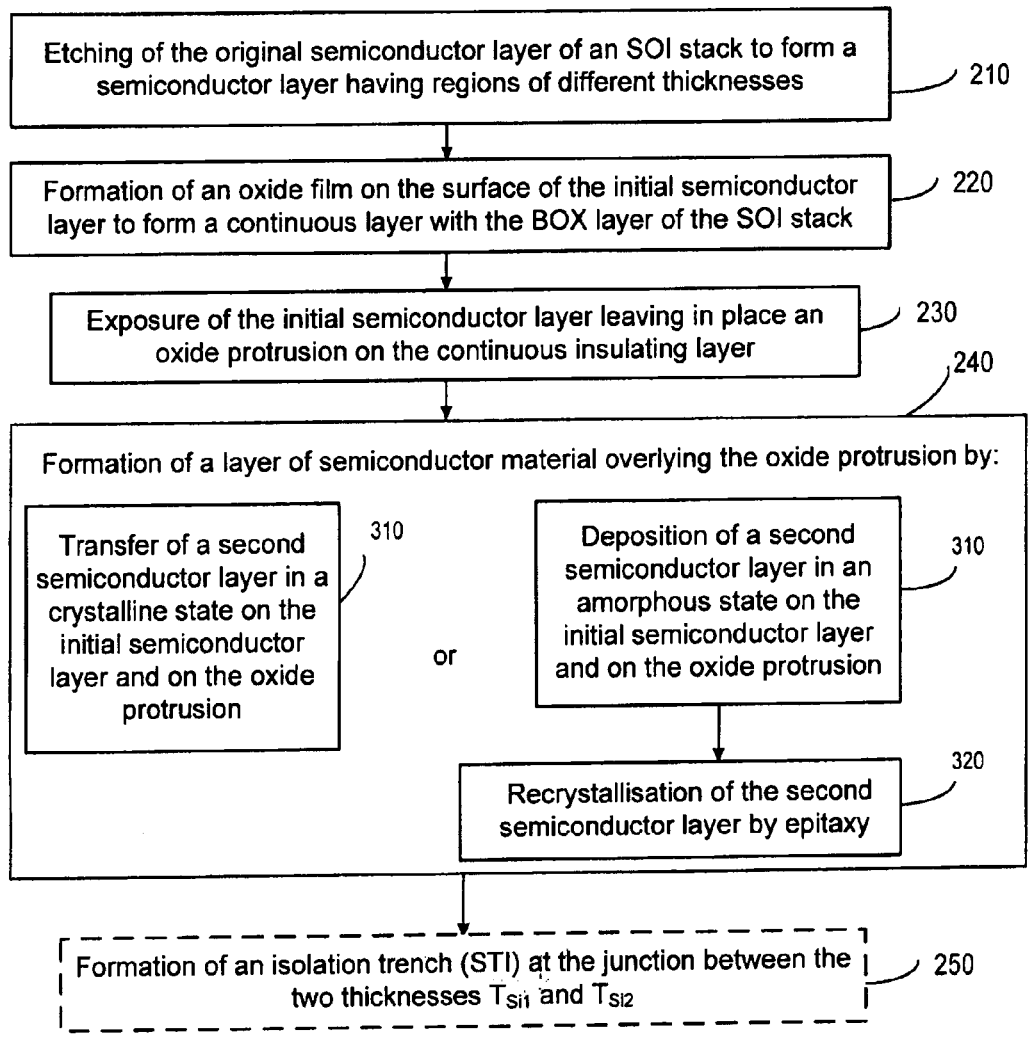
FIG. 1 summarises the main steps of an example embodiment of the manufacture of a substrate of the semiconductor on insulator type possessing a semiconductor layer having at least two different thicknesses.

The drawings are given by way of examples and are not limitative of the invention. They constitute schematic outline representations intended to facilitate understanding of the invention and are not necessarily to the scale of practical applications. In particular the relative thicknesses of the various layers and films do not represent reality.

DETAILED DESCRIPTION OF THE INVENTION

Before beginning a detailed review of embodiments of the invention, optional features are stated below, which may optionally be used in association or alternatively:

Advantageously, the film of oxide has a homogeneous thickness.

Advantageously, the partial removal of the film of oxide is effected so as to obtain a flat surface formed by the film of oxide in the at least one first region and by the first semiconductor region in the at least one second region.

Advantageously, the partial removal of the film of oxide comprises an etching step of the mechanical and chemical type (CMP). Preferably the etching is effected with stoppage on the first semiconductor layer. Preferably the etching is effected to as to form a flat face. This face is formed by the insulating film in the at least one first region and by the first semiconductor layer in the at least one second region.

According to a first embodiment, the second semiconductor region is a layer of monocrystalline semiconductor material.

Advantageously, the formation of a second semiconductor layer on the second layers comprises the transfer of a film of crystalline semiconductor material onto the stack. Preferably, the transfer of the film of semiconductor material is effected by a method comprising the detachment of this film of monocrystalline semiconductor material by rupture of a thicker layer at a weakened region of a donor substrate for monocrystalline semiconductor material. A person skilled in the art can refer for this purpose to the many known methods of transferring a layer by molecular bonding.

According to a second embodiment, the first semiconductor layer is crystalline and the formation of a second semiconductor layer on the stack of layers comprises: the deposition of a layer of amorphous semiconductor material on the first semiconductor layer and the film of oxide; heat treatment effected so as to crystallise the layer of amorphous semiconductor material by solid-phase epitaxy using the first semiconductor layer.

Advantageously, the formation of a second semiconductor layer on the stack of layers comprises the deposition of a semiconductor layer of constant thickness, that is to say homogeneous over the entire surface thereof, to within any imprecisions in manufacture.

Preferably, the local etching of the first semiconductor layer comprises, prior to the local etching, a step of oxidation of the first semiconductor layer in the regions to be etched and over a thickness corresponding to the thickness to be etched. Advantageously, the kinetics of etching of the oxide is very much superior to that of the semiconductor material. The oxidation step thus makes it possible to control the etched thickness better. Alternatively, no oxidation step is performed prior to the etching.

The localised etching is carried out so that the semiconductor layer remains continuous. The local etching therefore does not consume the entire thickness of the semiconductor layer, even in the thinnest regions.

Preferably, after the step of oxidation of the first semiconductor layer in the regions to be etched and before the selective etching, a levelling of the surface is effected by CMP polishing for example.

The etching may for example be a wet etching, for example using hydrochloric acid (HCl). Alternatively, use can be made of dry etching, based for example on fluorinated chemistry.

According to one embodiment, the method comprises a single sequence of steps, so as to define a semiconductor layer having only two regions of different thicknesses. According to an alternative embodiment, the method comprises at least two sequences of steps, so as to define a semiconductor layer having at least three regions with different thicknesses.

According to a particular embodiment, the transistor formation method comprises: the formation of a semiconductor layer having at least two different thicknesses ($T_{Si1}$, $T_{Si2}$); the formation of at least one transistor of a first type above at least one first region of the semiconductor layer; the formation of at least one transistor of a second type different from the first type above the at least one second region of the semiconductor layer. Thus the invention makes it possible to form transistors of different types according to the thicknesses of the semiconductor material on which they are situated.

Preferably, the method comprises the formation of isolation trenches at the interface between two regions of different thicknesses ($T_{Si1}$, $T_{Si2}$).

Advantageously, the two regions are adjacent.

According to one embodiment, at least one transistor of the logic type is formed above the at least one first region and at least one transistor of the analogue type is formed above the at least one second region. Preferably, all the transistors of the analogue type are formed above the at least one second region, that is to say on a thickness of semiconductor greater than the thickness of the first regions.

According to one embodiment, at least one field effect transistor of the fully depleted silicon on insulator (FDSOI) type is formed above the at least one first region. According to one embodiment, only FDSOI transistors are formed on the first region.

According to one embodiment, at least one transistor of the Trigate type, also referred to as Triple-Gate or Tri-gate, is formed above the second region.

According to one embodiment, a transistor of the Trigate type is formed above the second region, the thickness of which is great, preferentially greater than 10 nm (nanometers), while a transistor of the FDSOI type is formed above the first region, the thickness of which is thinner. The invention thus makes it possible to co-integrate these two types of transistor.

According to a particular embodiment, Trigate transistors are formed in a thick region and in a thin region. Preferably, these regions are adjacent. This makes it possible to have Trigate transistors of different heights and possibly very close to each other. The invention thus offers greater freedom for the value of the current.

Advantageously, the first portion of thickness $T_{Si1}$ of the semiconductor layer is intended to form a first channel for a first transistor. The second portion of thickness of the semiconductor layer is intended to form a second channel for a second transistor. The oxide protrusion is effected so that the width of this protrusion is greater than or equal to the sum of the widths of a gate stack and source and drain that are associated therewith.

Preferably, the local etching of the first semiconductor layer comprises, prior to the etching, a lithography step for protecting with the masks the regions that will not be etched.

Advantageously, the first semiconductor layer is based on silicon or germanium. The first semiconductor layer, also referred to as the active layer of the semiconductor on insulator stack, is a layer made from silicon, germanium or silicon-germanium. Preferably, the second semiconductor layer is a layer made from silicon, germanium or silicon-germanium.

Preferably, identical materials are provided for the first semiconductor layer and the second conductor layer. Alternatively, materials having mesh diameters that differ by less than 1% and preferably less than 0.5% in the plane parallel to the face of the substrate are provided for the first semiconductor layer and the second semiconductor layer.

Preferably, the initial insulating layer is a buried oxide layer of the stack of layers of the semiconductor on insulator type. Preferably, the first semiconductor layer is the active layer of the stack of layers of the semiconductor on insulator type.

Preferably the transistor is a transistor of the MOSFET (field effect transistor) type.

The present invention is particularly suited to substrates of the semiconductor on insulator type, such as elaborate substrates of the silicon on insulator (SOI) type with a thin buried oxide layer (buried insulating oxide, BOX). This is because, by virtue of the invention, the thickness of the initial insulating layer is preserved, no etching of the initial BOX being necessary for obtaining a buried source and drain.

In the context of the present invention, the term "on", "surmounts" or "underlying" does not necessarily mean "in contact with". Thus, for example, the deposition of a first layer on a second layer does not necessarily mean that the two layers are directly in contact with each other but means that the first layer at least partially covers the second layer while being either directly in contact therewith or being separated from it by another layer or another element.

In the context of the present invention, homogeneous thickness means a thickness that is homogeneous, in particular for the thinnest films, at all points on the layer or which does not vary by more than 1 nm and preferably not more than 0.5 nm over the entire surface of the layer. Typically, this variation in thickness is unintentional. It results for example from imprecisions inherent in the method of forming or thinning the semiconductor layer.

Typically, in the context of the present invention, the initial semiconductor layer, that is to say the semiconductor layer of the substrate of the semiconductor on insulator type on which the method according to the invention is implemented, has a thickness that does not vary by more than 2 nm. For example, the initial thickness is 10 nm.

In the context of the present invention, different thicknesses means thicknesses of the regions of a layer that differ by for example 2 nm or more when the mean thickness of the layer is 5 nm. This difference in the thicknesses of the regions is greater than local fluctuations of for example plus or minus 0.5 nm on the mean thickness of this layer, which is for example 5 nm thick.

At the end of the method according to the invention, two regions of the semiconductor layer have respective thicknesses of for example 5 and 10 nm or 5 and 7 nm.

Non-limitatively, regions with different thicknesses are regions that have a difference in thickness of at least 15%, preferably at least 20% and preferably at least 50%.

In the context of the present invention width means dimensions taken in a direction parallel to the plane of the bottom interface of the substrate 112 and in the direction of movement of the electrons in a channel 180. Thickness means a dimension taken in a direction perpendicular to the plane of the bottom face of the substrate 112. Thus, in the figures illustrated, the thicknesses are taken in a vertical direction and the widths are taken in a horizontal direction.

The embodiment that will now be described proposes a method for manufacturing a stack of layers of the semiconductor on insulator type, the active layer of which, made from semiconductor material, has at least two different thicknesses $T_{Si1}$ and $T_{Si2}$. FIG. 1 summarises the main steps of manufacturing such a stack. These steps will next be described with more detail with reference to FIGS. 2a to 7. Only two thicknesses $T_{Si1}$ and $T_{Si2}$ and two transistors 200 and 500 will be illustrated in these figures in order to facilitate understanding of the invention. Naturally a higher number of thicknesses and a higher number of transistors may be produced on the same wafer.

Figure 2A:
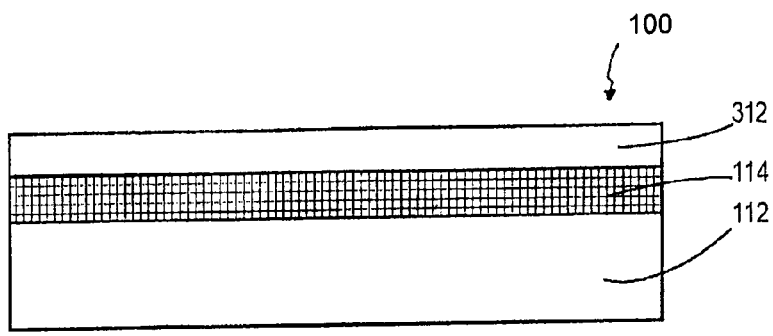
FIG. 2a illustrates the starting structure of a stack of the conventional semiconductor on insulator type.

FIG. 2a depicts a stack 100 of the conventional semiconductor on insulator type, for example of the SOI (silicon on insulator) type. Thus the starting structure comprises a substrate 112, often referred to as the carrier substrate or base substrate, an insulating layer 114 (thin or thick), usually a buried oxide layer (BOX, standing for buried oxide), and a semiconductor layer 312 situated on the insulating layer 114.

This semiconductor layer 312 is referred to as the first semiconductor layer 312 in the remainder of the description. Preferably, the thickness of the first semiconductor layer 312 at the start of the method is homogeneous. Advantageously, the thickness of the layer 114 does not constitute a constraint for implementing the invention. Advantageously, the stack 100 being conventional, the insulating layer 114 has a constant thickness and the top face thereof is flat.

Figure 2B:
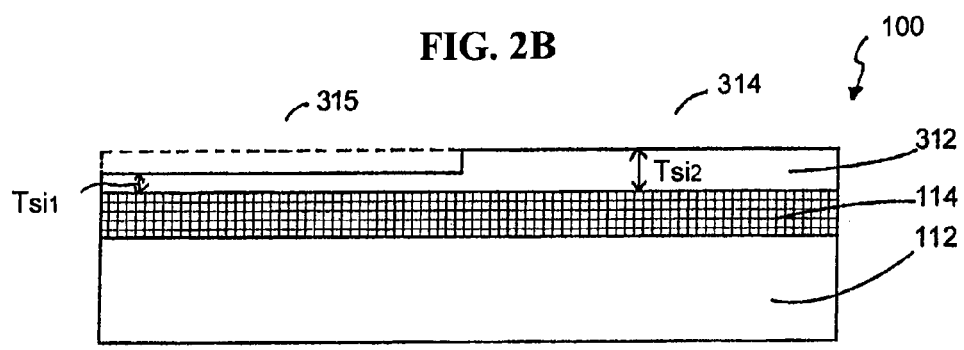
FIG. 2b illustrates the structure obtained at the end of the step of local etching of the first semiconductor layer.

FIG. 2b illustrates the structure obtained at the end of step 210 comprising an etching of the semiconductor layer 312. The etching is stronger in first regions referenced 315, which then form cavities or hollows which, in second regions referenced 314, then form projections. In a particular embodiment, the regions 314 of the semiconductor layer 312 are not etched. In another embodiment, these regions 314 are etched but less deep than the regions 315. In FIG. 2b, the broken lines illustrate the thickness of material that was taken from the first regions 315 and which has not been taken from the second regions.

Thus the regions 315 have a thickness $t_{Si1}$ less than the thickness $t_{Si2}$ of the regions 314. This difference in thickness forms a step on the surface of the stack 100.

The etching is preferably between 5 and 20 nm (nanometers). The etching is defined so as to leave semiconductor material in place in the most deeply etched regions 315. Preferably, a thickness of the semiconductor layer 312 of around 1 to several nm is kept in the bottom of the first regions 315. The semiconductor material is for example silicon, germanium or silicon-germanium.

In order to locally etch the first semiconductor layer 312, it is possible first to perform a lithography step in order to form a mask resisting etching and covering the regions 314 that it is not wished to etch.

According to a first particular embodiment, the etching of the semiconductor layer 312 is performed directly through the mask.

According to another embodiment, the etching of the layer 312 is performed after oxidation of the layer 312 through a mask masking the second regions 314. This oxidation step thus oxidises the regions 315 not protected by the mask. Preferably, a step of smoothing the external surface of the stack obtained after the localised oxidation is then performed (by CMP for example). Next a selective etching of the oxidised regions is carried out with respect to the non-oxidised or less oxidised regions. This etching comprises for example an etching with a solution based on hydrochloric acid (HCl). According to another embodiment, a dry etching, for example based on a fluorinated chemistry, can also be envisaged.

This oxidation step makes it possible to control very precisely the thickness that it is wished to etch, taking advantage of the high selectivity to etching of the oxide compared with the semiconductor material. The oxidation thickness then directly defines the thickness of the regions of the layer 312 to be etched subsequently. It should be noted that oxidation tends to increase the size of the patterns to be etched and it is therefore necessary to take this into account during the step of defining the dimensions of the first 315 and second 314 regions.

Figure 3:
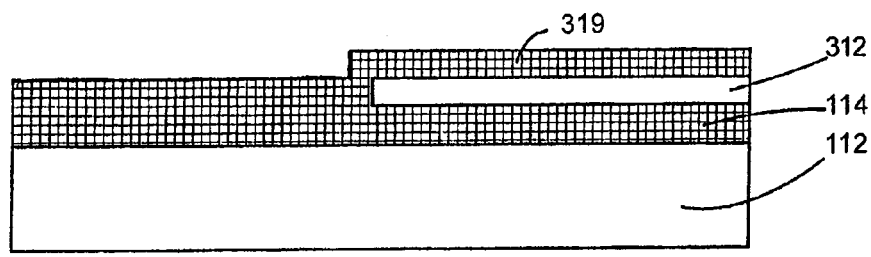
FIG. 3 illustrates the structure obtained at the end of the step of formation of a continuous film of oxide by oxidation of the first semiconductor layer.

FIG. 3 illustrates the structure obtained at the end of step 220 of forming a continuous film of oxide 319 by oxidation of the semiconductor layer 312 from its face turned towards the outside. Thermal oxidation is carried out in order to form a continuous film of oxide 319 on the uncovered surface of the first semiconductor layer 312. The mask or the layer of resin used to effect the definition of the first 315 and second 314 regions will have been removed previously.

The oxidation parameters, in particular the duration of oxidation, are to be defined so as to oxidise the whole of the thickness of the semiconductor layer 312 at the first regions 315. Thus all the layer 312 situated in line with the regions 315 is oxidised. The film of oxide 319 formed in the region 314 therefore extends as far as the insulating layer 114. A step, as illustrated in FIG. 3, is formed at the junction between the already oxidised layer 312 in line with the regions 315 and the film of oxide 319. The film of oxide 319 forms, with the insulating layer 114, an uninterrupted or continuous layer of oxide where it consists of an insulating material.

The oxidation may enlarge the size of the first regions 315 of the first semiconductor layer 312, which is not a problem in itself. It is then simply necessary to anticipate this as from step 210 in order to define the width of the patterns of the mask and the first regions 315 to be etched before oxidation.

Figure 4:
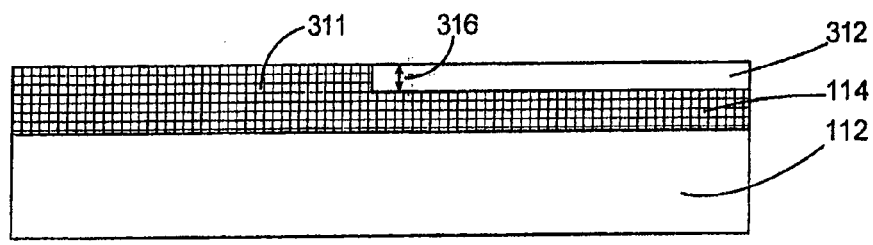
FIG. 4 illustrates the structure obtained at the end of the step of baring the first semiconductor layer in the non-etched region and leaving in place part of the film of oxide in the etched region.

FIG. 4 illustrates the structure obtained at the end of step 230 of baring the semiconductor layer 312, leaving in place the film of oxide 319 in the regions 315. This film of oxide 319 thus forms a layer of oxide 311 on the surface of the insulating layer 114 of the initial stack. The layer 311 constitutes a protrusion. These protrusions may also be referred to as oxide pads. This step 230 consists of removing the oxidised regions on top of the first semiconductor layer 312 by performing a polishing, such as a chemical-mechanical polishing (CMP). The CMP polishing preferably stops on the layer 312 still present in the second region 314. Thus, after CMP, there is no longer any oxide on top of the layer 312 and the layer 312 is therefore completely uncovered. Only the layer 311 remains. Preferably, the free face of the stack, that is to say the top face of the figures, is flat over the whole of the wafer. The thickness 316 of the layer 311 is substantially equal to that of the semiconductor layer 312 that remains after CMP.

Figure 5A:
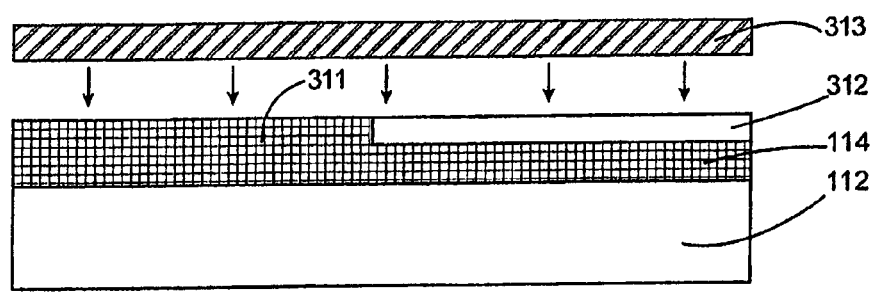
FIGS. 5a to 5c illustrate the structure obtained at the end of the steps of formation of a semiconductor layer on the stack.
Figure 5B:
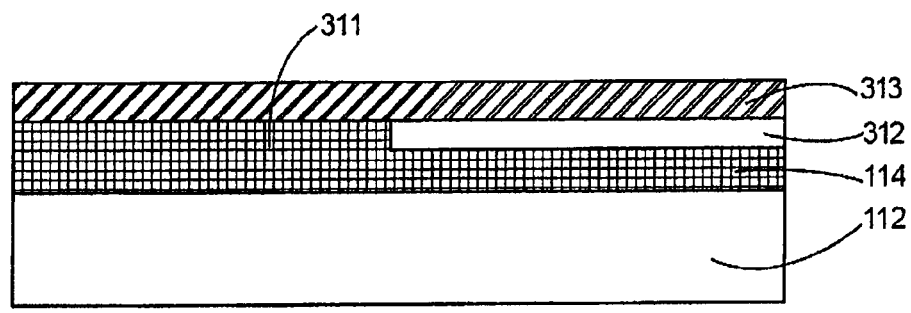
Figure 5C:
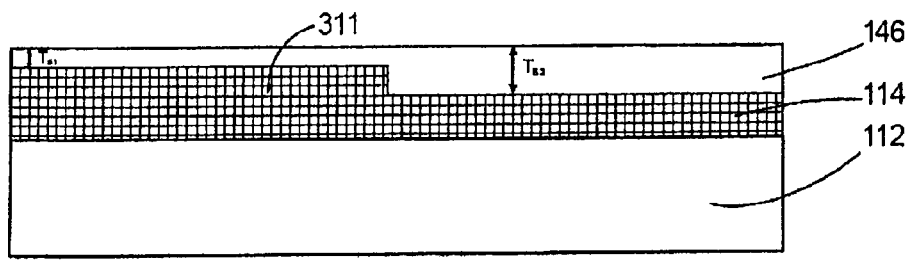

Next, FIGS. 5a to 5c illustrate the structure obtained at the end of the step 240 of forming an uninterrupted or continuous semiconductor layer 146 covering the layer 311. The step 240 comprises a step 310 of the embodiment illustrated in FIG. 5a or step 320 of the embodiment illustrated in FIG. 5b. FIG. 5c illustrates the structure obtained at the end of each of these two embodiments.

Figure 7:
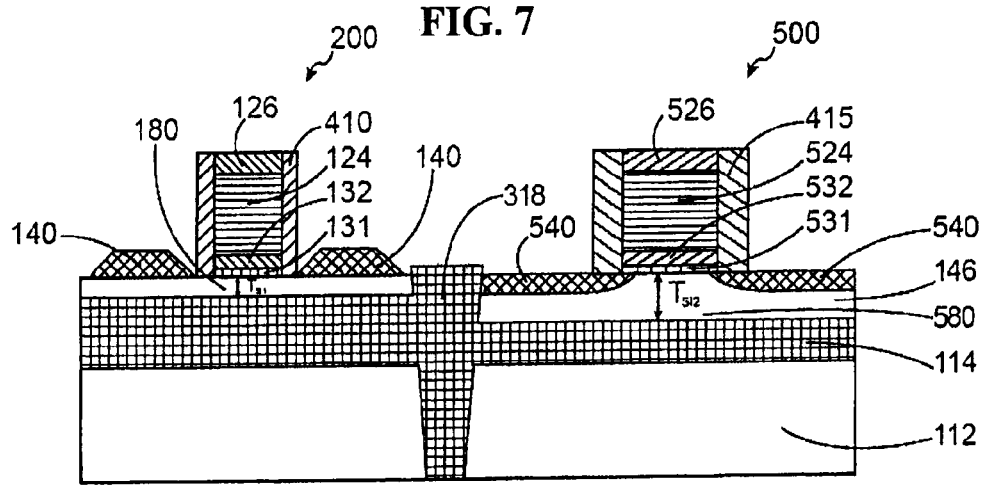
FIG. 7 illustrates an example of a logic transistor and an analogue transistor formed on different thicknesses of the semiconductor layer of the stack.

Step 310, illustrated in FIG. 5a, consists of depositing a layer 313 intended to form a channel 180 for transistors 200 produced on a low thickness of the semiconductor layer (see FIG. 7). The layer 313 is made from a semiconductor material, advantageously crystalline, made from silicon for example. The thickness of the layer 313 is preferably between 5 and 20 nm. Advantageously, this layer 313 is attached to the stack comprising the layer 311 from another structure, such as a donor substrate. To effect this transfer, it is possible for example to use the techniques well known to persons skilled in the art such as molecular bonding or grinding (abrasive cutting) that has been the subject of many publications. Typically, the semiconductor layer 313 is a thin film that is detached from a donor substrate, a weakened area previously having been created in this donor substrate, for example by ion implantation.

The semiconductor layer 312 and the semiconductor layer 313 form an uninterrupted or continuous semiconductor layer 146, as illustrated in FIG. 5c. The uninterrupted or continuous semiconductor layer 146 comprises two portions with distinct thicknesses ($T_{Si1}$ and $T_{Si2}$), which can then form two channels 180 and 580 for two transistors 200 and 500, as will be described below.

In this embodiment, preferably, the semiconductor layer 312 and the semiconductor layer 313 are monocrystalline.

After deposition of the layer 313, the thickness of the final semiconductor layer 146 is adjusted by effecting a CMP polishing. In this way the thickness $T_{Si1}$ of the second semiconductor layer 313 situated above the protrusion 311 is adjusted. This step may be optional.

This embodiment is particularly advantageous for obtaining a monocrystalline channel without any defect in the crystalline structure, including in the middle of the channels 180 and 580. The channels 180 and 580 are therefore homogeneous and have a crystalline structure without defects or with a limited number of defects.

According to the other method, the uninterrupted or continuous semiconductor layer 146 is re-formed by deposition of the semiconductor layer 313 in amorphous phase and by solid-phase epitaxy. The amorphous semiconductor material of the layer 313 is deposited, at a temperature for example of 400° C., on the layers 311 and the remaining portions of the first semiconductor layer 312.

FIG. 5b illustrates the structure obtained during the step 320 of recrystallisation of the semiconductor material of the amorphous layer 313, a recrystallisation initiated from the crystalline structure of the semiconductor layer 312 present in the regions 314.

In the case where this material is amorphous silicon, a heat treatment is effected at a preferential temperature of 500° C., for a recrystallisation of the amorphous silicon of the layer 313 to be initiated by the crystalline semiconductor material of the layer 312. Thus a crystalline semiconductor layer 146 is formed as illustrated in FIG. 5c. Preferably, the layer 312 is monocrystalline and the layer 146 obtained after recrystallisation of the layer 313 is also monocrystalline.

The stack illustrated in FIG. 5c thus has a semiconductor on insulator structure, with as a particularity the fact that the semiconductor layer has different thicknesses and the insulating layer is continuous. The insulating layer 114 also has different thicknesses.

It will be noted that the junction between the regions of high thickness and low thickness is abrupt.

It will also be noted that the face turned towards the outside of the semiconductor layer 146 is flat even though this layer comprises different thicknesses. To perform the subsequent step of definition of the structures, the stack can therefore be manipulated and treated in the same way as a conventional SOI stack.

This stack is for example ready for producing the gate stacks in order to form the logic transistor 200 and the analogue transistor 500 matched with the logic transistor 200.

In some applications, it may be desirable to have better electrical insulation between the two regions of thicknesses $T_{Si1}$ and $T_{Si2}$. An isolation trench 318 at the junction between the two thicknesses $T_{Si1}$ and $T_{Si2}$ can therefore be produced, as illustrated in FIG. 6.

Figure 6:
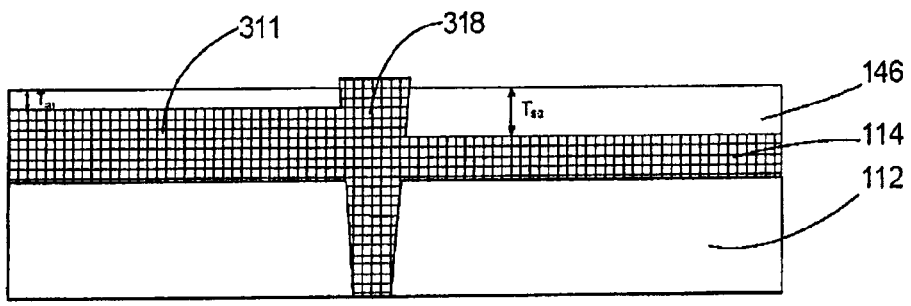
FIG. 6 illustrates the structure obtained at the end of the optional step of production of an isolation trench at the junction between the two regions of distinct thicknesses of the semiconductor layer.

FIG. 6 illustrates the structure obtained at the end of the aforementioned optional step 250 of producing an isolation trench 318. The isolation trench 318 is preferably an isolation trench of the STI type (shallow trench isolation).

The semiconductor layer 146 comprises two isolated portions: the semiconductor layer 146 of thicknesses $T_{Si1}$ and the semiconductor layer 146 of thicknesses $T_{Si2}$.

By virtue of the formation of the semiconductor layer 146 with distinct thicknesses $T_{Si1}$ and $T_{Si2}$, as illustrated in FIGS. 5c and 6, field effect transistors of the fully depleted silicon on insulator (FDSOI) and Trigate type can be produced on the same wafer and very close together. Typically, a transistor of the FDSOI type is formed above the portion of thickness $T_{Si1}$ and a transistor of the Trigate type is formed above the portion of thickness $T_{Si2}$, $T_{Si2}$ being greater than $T_{Si1}$.

According to a particular embodiment, Trigate transistors are formed in the very thick region $T_{Si2}$ and the region of lesser thickness $T_{Si1}$. This makes it possible to have Trigate transistors with different heights and adjacent.

In addition, a pair of logic-analogue transistors requiring two different thicknesses of the semiconductor layer 146 can also be produced on the same wafer illustrated in FIG. 5c or 6.

FIG. 7 illustrates an example of a logic transistor 200 and an analogue transistor 500 formed respectively on the thicknesses $T_{Si1}$ and $T_{Si2}$ of the semiconductor layer 146 of the SOI substrate.

The gate stack of the logic transistor 200, produced above the portion of thickness $T_{Si1}$ of the semiconductor layer 146, comprises for example the following layers stacked from the semiconductor layer 146: an isolation layer of the gate, often referred to as thin gate oxide 131 or high-k layer, a metal layer 132, a gate 124 also referred to as a gate electrode, and a hard mask 126 covering the top surface of the gate 124.

Protective layers, normally referred to as spacers 410, are situated on either side of the gate stack, extending mainly perpendicular to the plane of the substrate 112 and covering the flanks of the gate 142 at least. They are advantageously made from silicon nitride. The hard mask 126 and the spacers 410 protect the gate stack so that the flanks of the gate stack are not etched during operations that may follow. In particular, as will emerge in the remainder of the description, the hard mask 126 and the spacers 410 are made from materials resisting the etching substances.

The gate stack of the analogue transistor 500 is produced above the portion of thickness $T_{Si2}$ of the semiconductor layer 146. The structure of the analogue transistor 500 preferably comprises the same stack as that of the logic transistor 200. According to one embodiment, the gate stack of the analogue transistor 500 may comprise: an isolation layer of the gate 531, a metal layer 532, a gate 524 and a hard mask 526 covering the top surface of the gate 524.

The gate stacks are produced conventionally, for example by a succession of lithographies and etchings.

Advantageously, the channels 180 and 580, respectively formed by the two portions of distinct thicknesses $T_{Si1}$ and $T_{Si2}$ of the semiconductor layer 146, are a monocrystalline semiconductor material.

The source and drain 140 of the logic transistor 200 and those of the analogue transistor 500 are also produced in a conventional manner. Preferably, the source and drain 140 are formed on either side of the gate 124 above the top face of the semiconductor layer 146 of thickness $T_{Si1}$.

The source and drain 540 of the analogue transistor 500, illustrated in FIG. 7, are formed on either side of the gate stack 524 and within the portion of thickness $T_{Si2}$ of the semiconductor layer 146, by ion implantation or doping for example.

The invention is not limited to the gate stacks described above and some of the layers mentioned below may not be present or other layers may be added without departing from the scope of the present invention.

In the light of the above description, it is clear that the present invention offers a simple and reliable solution for forming a semiconductor layer having different thicknesses. Furthermore, the invention procures the following advantages:

it makes it possible to improve control of the uniformity and thickness of the final semiconductor layer. The steps of oxidation, etching and CMP polishing make it possible to obtain a precise sizing of the structures. The uniformity, thickness and size of the protrusions 311 of the insulating layer 114 are better controlled than with the solutions based on implantation and SIMOX annealing steps;

the profile of the insulating layer 114 at the junction between two different thicknesses $T_{Si1}$ and $T_{Si2}$ is abrupt. It is therefore possible to bring the transistors disposed on either side of the junction closer together. The integration density is therefore improved;

the invention also makes it possible to reduce the number of defects at the junction between two different thicknesses $T_{Si1}$ and $T_{Si2}$ of the insulating layer 114;

in addition, the invention enables the direct formation of a flat surface of the semiconductor on insulator type common to the semiconductor layer 146 overhanging two distinct thicknesses $T_{Si1}$ and $T_{S12}$ of the insulating layer 114.

It should be noted that, though in the embodiment described above the final semiconductor layer comprises only two thicknesses, it will be possible to provide more than two different thicknesses for the same semiconductor layer.

For this purpose, several sequences each comprising steps 210 to 310 will for example be repeated. For a sequence it will be possible in particular to effect the local etching of step 210 on a portion only of the region already etched locally during a previous sequence.

According to another embodiment, the first semiconductor layer 312 of the initial stack does not have a homogeneous thickness.

Preferably, and as shown in the figures, the insulating layer 114 has a face directly in contact with the substrate 112. Preferably, and as shown in the figures, the insulating layer 114 has a face directly in contact with the first semiconductor layer 312 and then the semiconductor layer 146 obtained at the end of the method.

The invention is not limited to the embodiments described above but extends to all embodiments covered by the claims.

The invention claimed is:

1. A method for producing a semiconductor layer having at least two different thicknesses (TSi1, TSi2) from a stack of the semiconductor on insulator type comprising at least one substrate on which an insulating layer and a first semiconductor layer are successively disposed, the method comprising at least a sequence comprising the following steps:

etching of the first semiconductor layer so that the first semiconductor layer is continuous and comprises at least one first region the thickness (tsi1) of which is less than the thickness (tSi2) of at least one second region;

oxidation of the first semiconductor layer in order to form an electrically insulating oxide film on the surface of the first semiconductor layer so that, in the first region, the oxide film extends as far as the insulating layer and so that in the second region the oxide film does not extend as far as the insulating layer;

partial removal of the oxide film so as to bare the first semiconductor layer outside the first region and to keep at least part of the oxide film in the first region;

formation on the stack of layers of a second semiconductor layer so as to form, with the first semiconductor layer, a third continuous semiconductor layer having different thicknesses (TSi1, TSi2).

2. A method according to claim 1, wherein the partial removal of the oxide film is effected so as to obtain a flat surface formed by: the oxide film in the at least one first region and the first semiconductor layer in the at least one second region.

3. A method according to claim 1, in which the partial removal of the oxide film comprises an etching step of the mechanical and chemical (CMP) type.

4. A method according to claim 1, wherein the second semiconductor layer is a layer of monocrystalline semiconductor material.

5. A method according to claim 1, wherein the formation of a second semiconductor layer comprises the transfer of a film of crystalline semiconductor material onto the first semiconductor layer and onto the oxide film.

6. A method according to claim 1, wherein the first semiconductor layer is crystalline and wherein the formation of a second semiconductor layer comprises:

the deposition of a layer of amorphous semiconductor material on the first semiconductor layer and the oxide film, heat treatment carried out so as to crystallise the layer of amorphous semiconductor material by solid-phase epitaxy from the first semiconductor layer.

7. A method according to claim 1, wherein said etching of the first semiconductor layer so that the first semiconductor layer is continuous and comprises at least one first region the thickness (tSi1) of which is less than the thickness (tSi2) of at least one second region comprises: a prior step of oxidation of the first semiconductor layer solely in the at least one first region and a subsequent step of selective etching of the oxidised semiconductor material with respect to the non-oxidised semiconductor material.

8. A method according to claim 1, comprising a single sequence of steps, so as to define a semiconductor layer having only two regions of different thicknesses (tSi1, tSi2).

9. A method according to claim 1, comprising at least two sequences of steps, so as to define a semiconductor layer having at least three regions of different thicknesses.

10. A method according to claim 1, herein different materials having mesh parameters that differ by less than 1% and preferably less than 0.5% in the plane parallel to the face of the substrate are provided for the first semiconductor layer and the second semiconductor layer.

11. A method for forming transistors, comprising:
the formation of a semiconductor layer having at least two different thicknesses (TSi1, TSi2) according to claim 1;
the formation of at least one transistor of a first type above at least one first region of the semiconductor layer;
the formation of at least one transistor of a second type different from the first type above at least one second region of the semiconductor layer, the thickness of the semiconductor layer in the first region being different from the thickness of the semiconductor layer in the second region.

12. A method according to claim 11, comprising the formation of isolation trenches at the interface between two regions with different thicknesses (TSi1, TSi2).

13. A method according to claim 11, wherein the first and second regions are adjacent or separated by an isolation trench.

14. A method according to claim 11, wherein at least one transistor of the logic type is formed above the at least one first region and at least one transistor of the analogue type is formed above the at least one second region.

15. A method according to claim 11, wherein at least one field effect transistor of the fully depleted silicon on insulator (FDSOI) type is formed above the at least one first region, the thickness of the semiconductor layer in the first region being less than the thickness of the semiconductor layer in the second region.

16. A method according to claim 11, wherein at least one transistor of the Trigate (Tri-gate) type is formed above the at least one second region, the thickness of the semiconductor layer in the first region being less than the thickness of the semiconductor layer in the second region.

17. A method according to claim 11, wherein the first semiconductor layer is a layer of silicon, germanium or silicon-germanium and wherein the second semiconductor layer is a layer of silicon, germanium or silicon-germanium.

18. A method according to claim 11, wherein identical materials are provided for the first semiconductor layer and the second semiconductor layer.

* * * * *